United States Patent
Ciancio et al.

(10) Patent No.: US 7,078,785 B2
(45) Date of Patent: Jul. 18, 2006

(54) SEMICONDUCTOR DEVICE AND MAKING THEREOF

(75) Inventors: Anthony Ciancio, Gilbert, AZ (US); Mark D. Griswold, Chandler, AZ (US); Amudha R. Irudayam, Chandler, AZ (US); Jennifer H. Morrison, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/668,694

(22) Filed: Sep. 23, 2003

(65) Prior Publication Data

US 2005/0062130 A1 Mar. 24, 2005

(51) Int. Cl.
*H01L 29/00* (2006.01)
*H01L 29/76* (2006.01)
*H01L 29/94* (2006.01)

(52) U.S. Cl. .................... 257/532; 257/306
(58) Field of Classification Search ............. 257/306, 257/532; 438/244, 957
See application file for complete search history.

(56) References Cited

U.S. PATENT DOCUMENTS

| 5,747,361 A | 5/1998 | Ouellet |
| 5,759,916 A | 6/1998 | Hsu |
| 6,005,277 A | 12/1999 | Liu |
| 6,099,701 A * | 8/2000 | Liu et al. ............... 204/192.22 |
| 6,204,069 B1 * | 3/2001 | Summerfelt et al. ........... 438/3 |
| 6,340,827 B1 | 1/2002 | Choi |
| 6,358,829 B1 | 3/2002 | Yoon |
| 6,821,839 B1 * | 11/2004 | Chung ........................ 438/240 |
| 6,982,230 B1 * | 1/2006 | Cabral et al. ............... 438/778 |
| 2003/0011043 A1 * | 1/2003 | Roberts ....................... 257/532 |
| 2004/0092073 A1 * | 5/2004 | Cabral et al. ............... 438/287 |

* cited by examiner

*Primary Examiner*—Evan Pert
*Assistant Examiner*—Victor A. Mandala, Jr.
(74) *Attorney, Agent, or Firm*—Cindy R. Simpson; Kim-Marie Vo

(57) ABSTRACT

By forming a conductive smoothing layer over the bottom electrode and/or a capacitor dielectric, a MIM capacitor with improved reliability due to reduction of geometrically enhanced electric fields and electrode smoothing is formed. In one embodiment, layer including a refractory metal or a refractory metal-rich nitride, is formed over a first capping layer formed of a refractory nitride. In addition, a second refractory metal or a refractory metal-rich nitride layer may be formed on the capacitor dielectric. The smoothing layer could also be used in other semiconductor devices, such as transistors between a gate electrode and a gate dielectric.

17 Claims, 4 Drawing Sheets

SEMICONDUCTOR DEVICE AND MAKING THEREOF

FIELD OF THE INVENTION

This invention relates, generally, to the field of semiconductor devices and more particularly to metal-insulator-metal (MIM) capacitors as used in semiconductor devices.

BACKGROUND OF THE INVENTION

As semiconductor devices shrink, there is a desire to decrease the area occupied by features, such as capacitors. To accommodate, capacitors are being formed over transistors (e.g., at the metal level) as opposed to being formed at the transistor level closer to the bulk semiconductor substrate. One example of such a capacitor is a metal-insulator-metal (MIM) capacitor which includes a MIM dielectric between a top electrode and a bottom electrode.

The metal layers may be formed using aluminum, copper, or alloys thereof. Typically, a capping layer or anti-reflective coating (ARC) is formed over the metal layers and can be used as the bottom electrode for the MIM capacitor being formed over the metal layers. In the industry, one such ARC material is TiN. While using the ARC as a bottom electrode is desirable for processing simplicity, the surface of the TiN in contact with the MIM dielectric is rough. The rough surface of the TiN creates geometrically enhanced fields which degrade the reliability of the MIM dielectric. Thus, a need exists to control the uniformity of the electric field especially when using TiN as an electrode in a MIM capacitor.

BRIEF DESCRIPTION OF THE DRAWINGS

The present invention is illustrated by way of example and not by limitation in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

The inventors have observed that MIM capacitors are susceptible to roughness from underlying layers. Typically, the metal line and a capping layer, which in one embodiment is a TiN layer, form the bottom electrode. (Alternatively, just the metal line or the TiN layer forms the bottom electrode.) Thus, a need exists for making the bottom electrode smoother. Although the metal line can be removed from underneath the MIM capacitor at the expense of increased process complexity instead of forming a smoothing layer, alternatively the smoothing layer can be used. Thus, the smoothing layer can be used regardless of the material used for the metal lines.

By forming a smoothing layer, such as refractory (metal)-rich nitride layer (e.g., a titanium-rich nitride (TiRN) layer) or pure metallic layer with an appropriate smoothness over the bottom electrode and/or a capacitor dielectric in accordance with an embodiment of the present invention, a MIM capacitor with improved reliability due to reduction of geometrically enhanced electric fields and electrode smoothing is formed. Embodiments of the invention will be described in regards to the figures.

Figure 1:
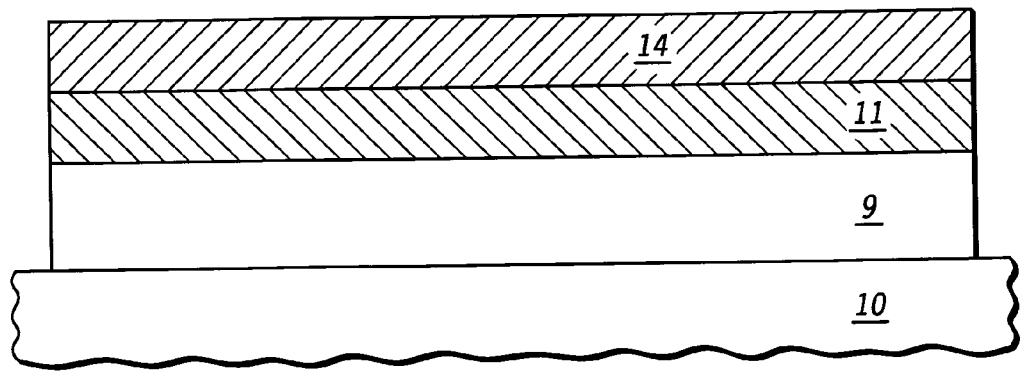
FIG. 1. illustrates a cross section of a part of a semiconductor device having a bottom electrode in accordance with an embodiment of the present invention.

FIGS. 1–9 illustrate a portion of a semiconductor device 5 as it undergoes a series of processing steps to form a MIM capacitor in accordance with the present invention. More specifically, FIG. 1 illustrates a first or bottom metal layer or interconnect layer 11 formed over an intermetal dielectric layer 9 and a semiconductor substrate 10. In a preferred embodiment, semiconductor substrate 10 is silicon. However, other semiconductor materials can be used such as gallium arsenide and silicon-on-insulator (SOI). Typically, substrate 10 will include a number and variety of active semiconductor devices (such as MOS and/or bipolar transistors). However, for purposes of understanding the present invention, an understanding of these devices is not necessary and thus these devices are not illustrated. The intermetal dielectric layer 9 can be any dielectric material formed by any process. For example, it may be silicon dioxide.

The first conductive layer 11 is formed over the semiconductor substrate 10 using physical vapor deposition (PVD), chemical vapor deposition (CVD), atomic layer deposition (ALD), electroplating, the like, and combinations of the above. In a preferred embodiment the first conductive layer 11 includes aluminum or copper. For example, the first conductive layer 11 can be copper or an aluminum copper alloy. In one embodiment, the conductive layer 11 is approximately 6,000 Angstroms of aluminum copper. In another embodiment, the first conductive layer 11 is predominately copper. Furthermore, the first conductive layer 11 may actually be formed of multiple materials. For instance in copper inlaid metallization schemes, diffusion barriers comprising tantalum or tantalum nitride are often formed prior to forming a copper layer.

To form the structure of FIG. 1, a first capping layer or anti-reflective coating (ARC) 14 is optionally formed over the first conductive layer 11 by PVD, CVD, ALD, electroplating, the like, and combinations of the above. Preferably the first capping layer 14 includes titanium, tantalum, nitride, tantalum nitride (TaN), titanium nitride (TiN), or the like. The first capping layer 14, preferably, is any refractory nitride. In one embodiment the first capping layer 14 is approximately 100–1000 Angstroms or more specifically, approximately 200–800 Angstroms of TiN and is preferably approximately 650 Angstroms. In another embodiment, the first capping layer 14 may be organic. Furthermore, the first capping layer 14 is optional. In this embodiment, a subsequently formed first smoothing layer 16 if formed over and in contact with the first conductive layer 11. In the embodiment shown in the figures, the first capping layer 14 is a bottom electrode. However, if the first capping layer 14 is not present or is not conductive, then the first conductive layer 11 or another conductive layer is the bottom electrode.

Figure 2:
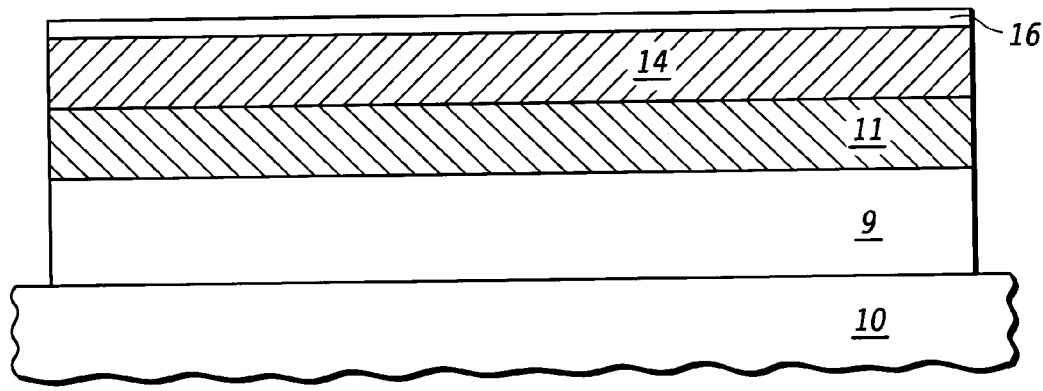
FIG. 2. illustrates the semiconductor device of FIG. 1 after forming a first barrier layer in accordance with an embodiment of the present invention.

As shown in FIG. 2, a first or bottom smoothing layer 16 is formed over the first capping layer 14 by PVD, CVD, ALD, electroplating, the like, and combinations of the above. In one embodiment, the first conductive smoothing layer 16 is approximately 50–500 Angstroms or more specifically, approximately 100–300 Angstroms of a refractory metal, such as titanium, or a refractory-rich nitride, such as titanium-rich nitride (TiRN). (The TiRN has a stoichiometric ratio of Ti:N that is greater than 1:1.) In one embodiment, the first conductive smoothing layer 16 is approximately 150 Angstroms in thickness.

The first conductive smoothing layer 16 can be any conductive material that has a surface roughness less than that of the first capping layer or bottom electrode 14. Experiments have been performed that show that 800 Angstroms of TiN has a (surface) roughness of approximately 49 Angstroms, whereas 650 Angstroms of TiN as the first capping layer and 150 Angstroms of TiRN as the first conductive smoothing layer has a (surface) roughness of approximately 25 Angstroms. Thus, in one embodiment, the first capping layer 14 is TiN and the first conductive smoothing layer 16 is TiRN. Preferably, the smoothing layer is a fine grain or amorphous layer because these layers typically are smoother than refractory nitrides used for the first capping layer because the refractory nitrides when formed on the metal line typically form columnar grains which are not as smooth as fine grain layers.

In a preferred embodiment, the first capping layer 14 is TiN formed by PVD and the first conductive smoothing layer 16 is TiRN, because processing complexity is reduced. To form the TiRN layer, argon (or any other nonreactive gas), flows in the PVD chamber and a plasma is formed. The argon ions bombard a poisoned TiN target. The poisoned TiN target is a titanium (Ti) target that due to a reaction with a nitrogen (N) plasma forms TiN as the top surface. When the argon ions bombard the poisoned target TiN is deposited on the semiconductor device. As the target becomes depleted of nitrogen, a deposited film has a higher titanium content creating a titanium-rich layer. This technique allows one to modulate the content of the deposited film from stoichiometric TiN to titanium and control the final (surface) roughness. Thus, the first conductive smoothing layer 16 may be TiRN (a refractory-nitride) and/or titanium (a refractory metal). Furthermore, the first conductive smoothing layer 16 may be a refractory metal, such as titanium without any nitrogen present.

The capacitor dielectric layer 18 is formed on the first conductive smoothing layer 16 using CVD, PVD, ALD, the like or combinations of the above. In one embodiment, the capacitor dielectric layer 18 preferably comprises a metal oxide which has high linearity (e.g., a normalized capacitance variation of typically less than 100 parts per million units of voltage), such as tantalum oxide and hafnium oxide. However, for general applications in which linearity may be less critical, other metal oxides such as zirconium oxide, barium strontium titanate (BST), and strontium titanate (STO) may be suitable. Alternatively, an insulator that is not a high dielectric constant material can be used, such as silicon dioxide. As used herein a high dielectric constant material is a material with a dielectric constant greater than that of silicon dioxide. The capacitor dielectric layer 18 may be a dielectric layer that is not a high dielectric constant material. For example, the capacitor dielectric layer 18 may be plasma-enhanced nitride (PEN), which is $Si_xN_y$. However, the presence of smoothing layers is more advantageous as the capacitor dielectric is scaled to improve the capacitance density because the effects of roughness become more significant and the importance of surface smoothing increase.

Figure 3:
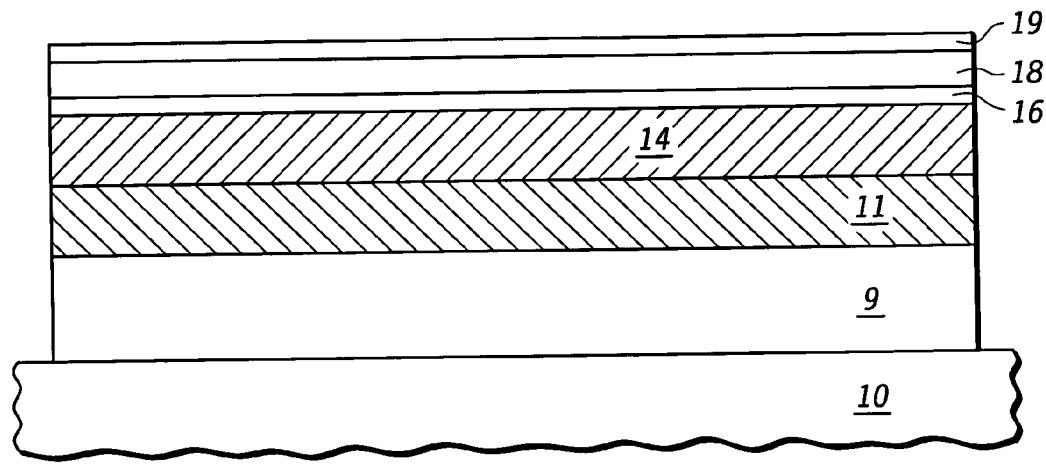
FIG. 3 illustrates the semiconductor device of FIG. 2 after forming a first dielectric layer and a second barrier layer in accordance with an embodiment of the present invention.

To form the structure of FIG. 3, a second or top smoothing layer 19 is formed on the capacitor dielectric layer 18. The second conductive smoothing layer 19 can be formed by any process used to form the first conductive smoothing layer 16, may be any of the material described for the first conductive smoothing layer 16, and may be the same dimensions as described for the first conductive smoothing layer 16. However, the first conductive smoothing layer 16 and the second conductive smoothing layer 18 need not be formed by the same process, be formed of the same material, or be the same dimensions, although using the same process and/or material may decrease processing complexity. Furthermore, the second conductive smoothing layer 19 should have a roughness less than a subsequently formed second conductive layer.

Figure 4:
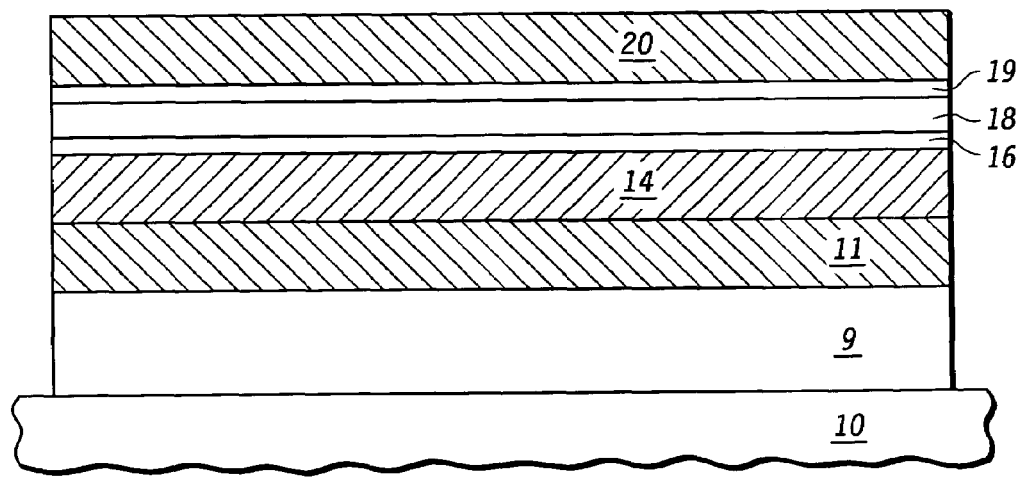
FIG. 4 illustrates the semiconductor device of FIG. 3 after forming a top electrode and a etch stop layer in accordance with an embodiment of the present invention.

As shown in FIG. 4, a second or top conductive layer 20 is formed on the second conductive smoothing layer 19 preferably using PVD, but other techniques including CVD, ALD, or combinations thereof could be used. The top conductive layer 20 will form the second (top) electrode of the capacitor and thus can be formed of any conductive material such as a metal nitride (e.g., tantalum nitride and titanium nitride), a conductive oxide (e.g., ruthenium oxide and iridium oxide), metals (e.g., copper and aluminum), metal alloys, combinations of the above, and the like. In one embodiment, the top conductive layer 20 comprises nitrogen and either tantalum or titanium (in the form of titanium nitride or tantalum nitride).

Figure 5:
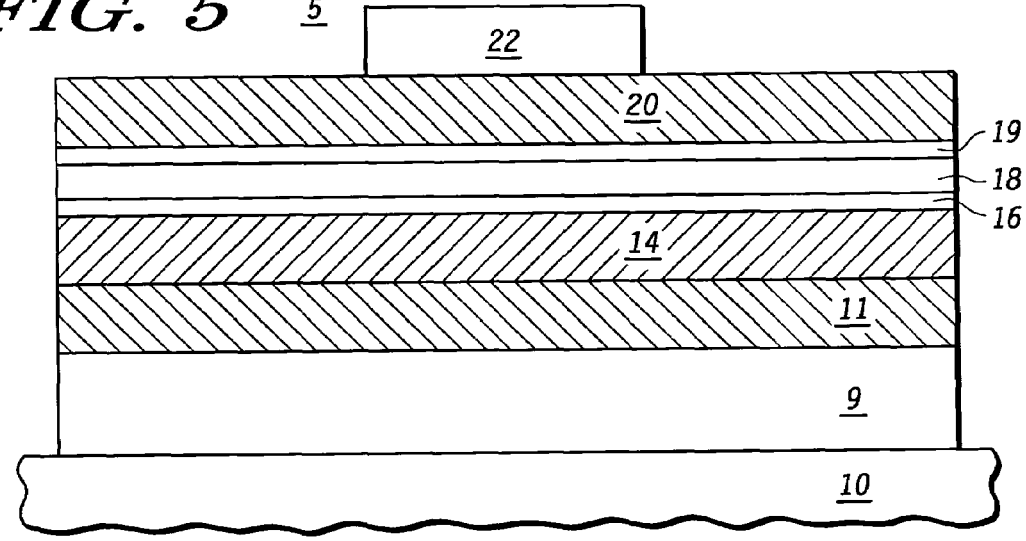
FIG. 5 illustrates the semiconductor device of FIG. 4 after forming a patterned photoresist layer in accordance with an embodiment of the present invention.

Turning to FIG. 5, a first photoresist layer 22 is deposited and patterned in order to subsequently etch the top conductive layer 20 and the second conductive smoothing layer 19. After etching the top conductive layer 20 and the second conductive smoothing layer 19 using conventional etching chemistries, a top electrode 24 (or second electrode 24) is formed, as shown in FIG. 6.

During the top electrode 24 formation, the capacitor dielectric layer 18 may be over-etched in order to guarantee that the top conductive layer 20 and the second conductive smoothing layer 19 are completely etched. This over-etch can be tailored to decrease the capacitor dielectric layer 18 to a desired thickness outside or beyond the capacitor area, if desired. Since the capacitor dielectric layer 18 will not be completely removed in areas that are not part of the MIM capacitor, the dielectric constant of the metal oxide can undesirably increase the capacitance in areas outside the MIM capacitor. Ideally, the etch would completely remove the capacitor dielectric layer 18. However, doing so in the embodiment shown in the figures could damage critical portions of the capacitor dielectric layer 18, the first conductive smoothing layer 16 and/or the surface of the bottom electrode 14.

Figure 6:
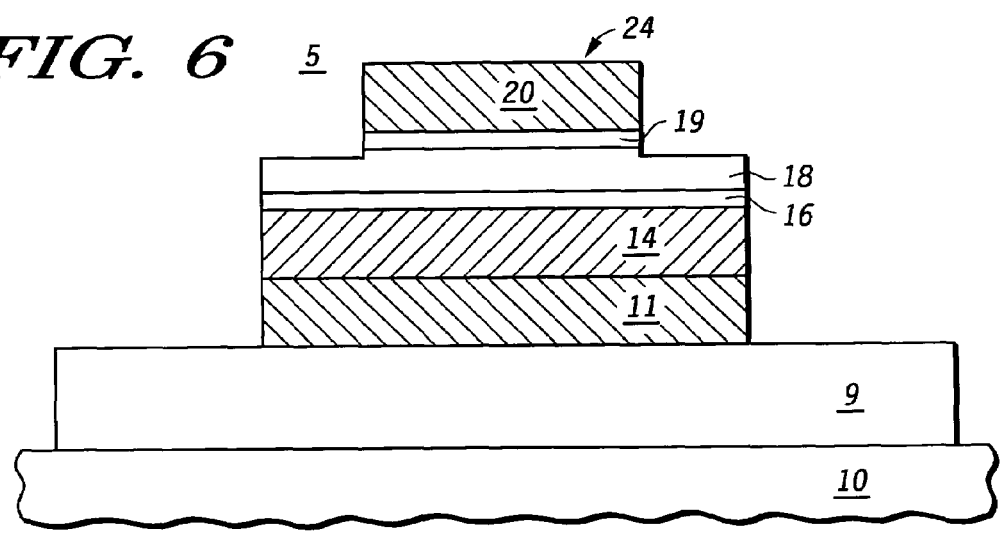
FIG. 6 illustrates the semiconductor device of FIG. 5 after patterning the etch stop layer, the top electrode and the second barrier layer in accordance with an embodiment of the present invention.

After patterning the top electrode 24, another photoresist (not shown) is formed over the semiconductor device 5 to etch the first conductive layer 11, the capping layer 14, the first conductive smoothing layer 16 and capacitor dielectric layer 18, as known in the industry resulting in the structure shown in FIG. 6.

Figure 7:
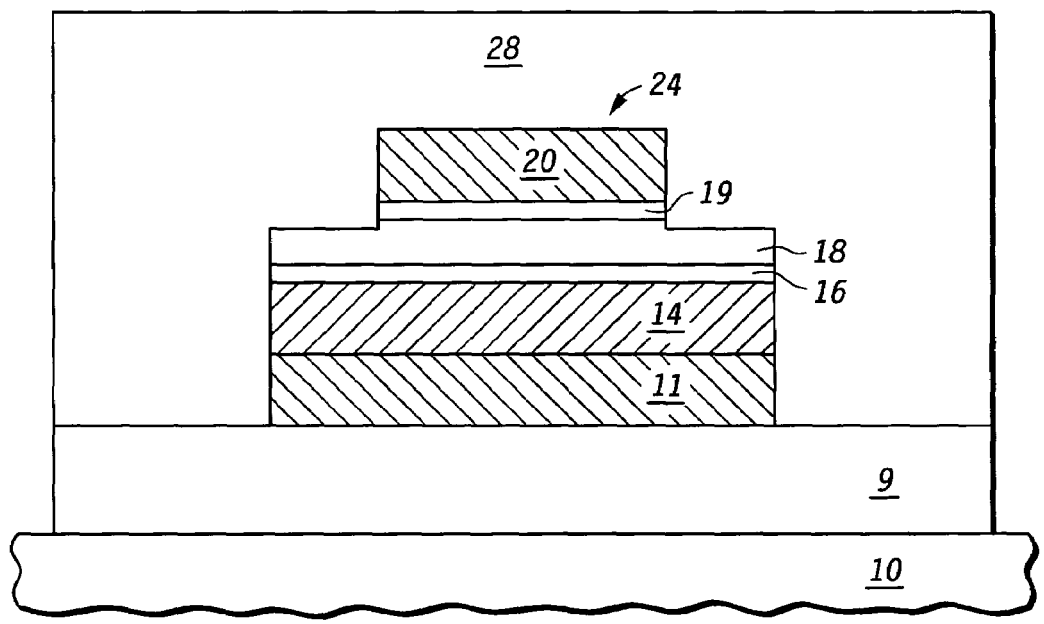
FIG. 7 illustrates the semiconductor device of FIG. 6 after forming a second dielectric layer in accordance with an embodiment of the present invention.
Figure 8:
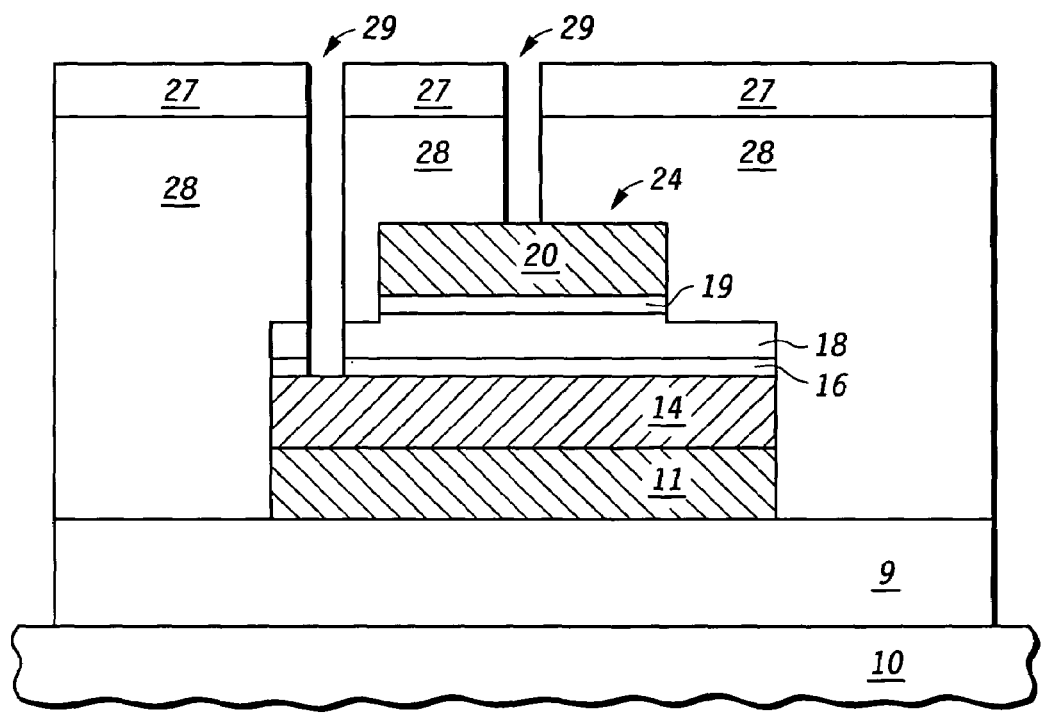
FIG. 8 illustrates the semiconductor device of FIG. 7 after forming a photoresist layer and etching vias in accordance with an embodiment of the present invention.

As shown in FIG. 7, an interlayer dielectric (ILD) 28 is deposited over the semiconductor substrate 10. The ILD can be any dielectric material, such as fluorinated silicon dioxide formed using tetraethoxysilane (TEOS). A second photoresist layer 27 is deposited and patterned in order to etch the ILD layer 28 to form via openings 29 as shown in FIG. 8. The chemistry of the via etch is selective to the second conductive layer 20. Conventional etch processes and chemistries can be used.

Figure 9:
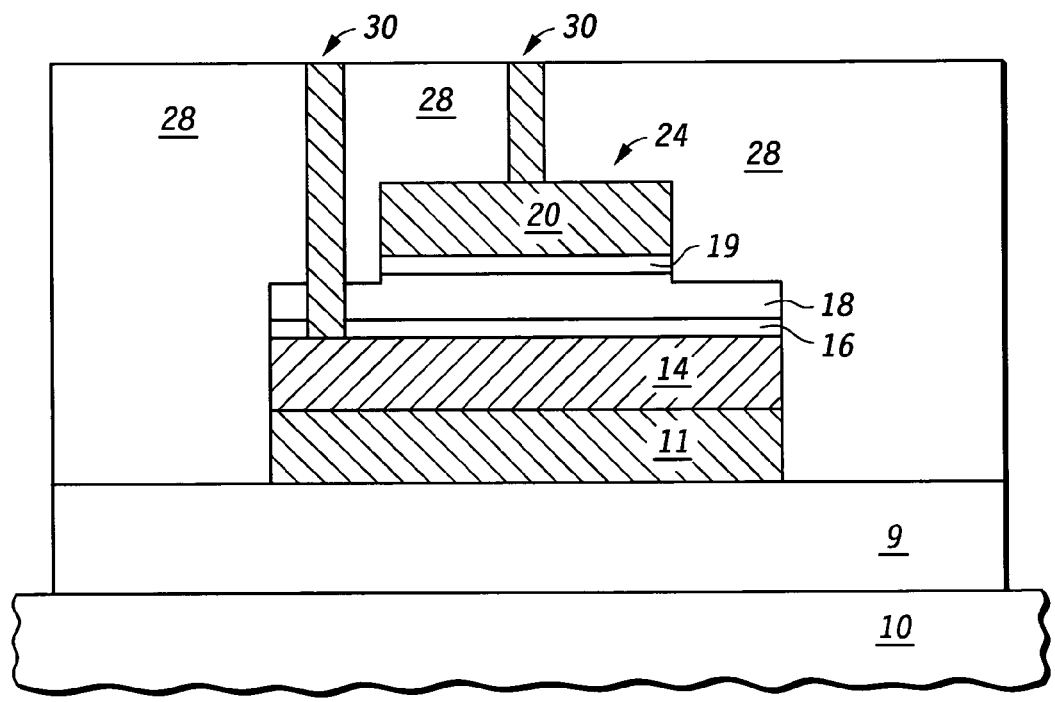
FIG. 9 illustrates the semiconductor device of FIG. 8 after filing the vias with a conductive material in accordance with an embodiment of the present invention.

After forming the via openings 29, a conductive material is formed within the via openings 29 in order to form conductive vias 30 as shown in FIG. 9. A conductor is formed in the via openings 29 to form contacts to the top electrode 24 and bottom electrode 14. In a preferred embodiment, copper is electroplated and chemically mechanically polished back to form the conductive vias 30.

The resulting MIM capacitor shown in FIG. 9 has the advantage of a decreased surface roughness between the electrodes (top and bottom) and the capacitor dielectric, resulting in improved reliability. Furthermore, the smoother interface allows for greater latitude in scaling the MIM capacitor. In addition, the time dependent dielectric breakdown (TDDB) is increased.

The embodiment described as shown in the figures is a MIM capacitor wherein the top electrode 24 is smaller in size compared to the bottom electrode 14. In another embodiment, the top electrode 24 can be oversized as compared to the bottom electrode 14. In this embodiment, the contact for the bottom electrode 14 may be formed prior to the formation of the bottom electrode 14 because the contact, instead of being formed over the bottom electrode, is underneath the bottom electrode 14. Related structures are not explicitly shown in the figures, but are generally always present on-chip as an essential part of the IC interconnect circuitry.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Figure 10:
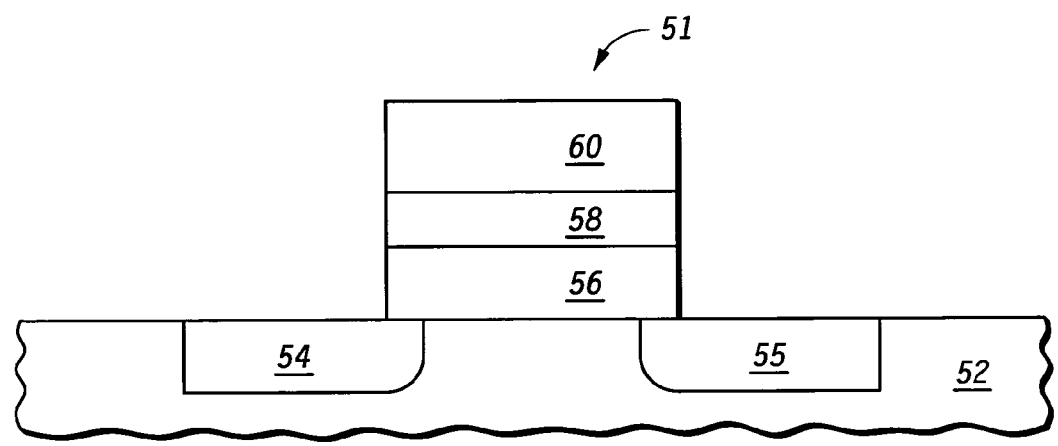
FIG. 10 illustrates a cross section of a part of a semiconductor device having a transistor formed in accordance with another embodiment of the present invention.

In the foregoing specification, the invention has been described with reference to specific embodiments. However, one of ordinary skill in the art appreciates that various modifications and changes can be made without departing from the scope of the present invention as set forth in the claims below. For example, the MIM capacitor could be formed using a dual damascene integration. Furthermore, although the use of the smoothing layers are taught with respect to a MIM capacitor, the smoothing layers can be used anywhere a rough surface is in contact with a dielectric to increase reliability. For example, a smoothing layer can be formed in contact with a gate dielectric and be part of a transistor 51, as shown in FIG. 10. A semiconductor device 50 includes a semiconductor substrate 52. Within the semiconductor substrate 52, source region 54 and drain region 55 are formed. The transistor includes the source region 54, the drain region 55, a gate dielectric 56 (which can be any dielectric material, such as a high dielectric constant material), a smoothing layer 58 (which is preferably conductive and can be any material previously described for smoothing layers) and a gate electrode 60 (which can be a metal, polysilicon and the like.). In this embodiment, a smoothing layer is in contact with a conductive layer (i.e., the gate electrode 60) and a dielectric layer (e.g., the gate dielectric 56), wherein the smoothing layer has a surface roughness less than that of the conductive layer.

Accordingly, the specification and figures are to be regarded in an illustrative rather than a restrictive sense, and all such modifications are intended to be included within the scope of present invention.

What is claimed:

1. A semiconductor device comprising:
    a semiconductor substrate;
    a first electrode formed over the semiconductor substrate;
    a first conductive smoothing layer formed over the first electrode, wherein the first conductive smoothing layer has a surface roughness less than that of the first electrode;
    a dielectric layer formed on the first conductive smoothing layer;
    a second electrode formed over the dielectric layer; and
    a second conductive smoothing layer formed between the dielectric layer and the second electrode, wherein the second conductive smoothing layer has a roughness less than that of the second electrode and wherein the second conductive smoothing layer comprises a refractory metal.

2. The semiconductor device of claim 1, wherein the first electrode comprises a first layer comprising a metal and a second layer comprising a refractory nitride and the second electrode comprises a metal.

3. The semiconductor device of claim 1, wherein the first electrode and the second electrode comprise a refractory nitride.

4. The semiconductor device of claim 3, wherein the refractory nitride comprises a material selected from the group consisting of titanium nitride and tantalum nitride.

5. The semiconductor device of claim 3, wherein the first conductive smoothing layer comprises titanium rich nitride.

6. The semiconductor device of claim 1, wherein the dielectric layer comprises a high dielectric constant material.

7. The semiconductor device of claim 1, wherein the first electrode, the first conductive smoothing layer, the dielectric layer and the second electrode are part of a metal-insulator-metal (MIM) capacitor.

8. The he semiconductor device of claim 7, further comprising:
    a capping layer over the first electrode, wherein the capping layer comprises a refractory nitride and the first electrode comprises a metal.

9. A semiconductor device comprising:
    a conductive layer;
    a smoothing layer formed in contact with the conductive layer, wherein the smoothing layer has a surface roughness less than that of the conductive layer and the smoothing layer comprises titanium rich nitride; and a dielectric layer formed above and in contact with the smoothing layer.

10. The semiconductor device of claim 9, wherein the conductive layer comprises titanium nitride and the smoothing layer comprises titanium.

11. The semiconductor device of claim 9, wherein the conductive layer, the smoothing layer and the dielectric layer are part of a device selected from the group consisting of a transistor and a capacitor.

12. The semiconductor device of claim 9, wherein the conductive layer comprises a first layer comprising a metal and a second layer comprising a refractory nitride.

13. The semiconductor device of claim 9, wherein the dielectric layer is a high dielectric constant material.

14. A semiconductor device comprising:
a semiconductor substrate;
a first electrode formed over the semiconductor substrate, wherein the first electrode comprises a first layer comprising metal and a second layer over the first layer, wherein the second layer comprises a refractory nitride;
a first smoothing layer formed over the first electrode, wherein the first smoothing layer comprises titanium rich nitride;
a dielectric layer formed on the first smoothing layer; and
a second electrode formed over the dielectric layer, wherein the second electrode comprises a third layer comprising a refractory nitride and a fourth layer over the third layer, wherein the fourth layer comprises a metal.

15. The semiconductor device of claim 14, wherein the refractory nitride comprises a material selected from the group consisting of titanium nitride and tantalum nitride.

16. The semiconductor device of claim 15, wherein the refractory metal comprises titanium.

17. A semiconductor device comprising:
a semiconductor substrate;
a first electrode formed over the semiconductor substrate;
a capping layer over the first electrode, wherein the capping layer comprises a refractory nitride and the first electrode comprises a metal;
a first conductive smoothing layer formed over the capping layer, wherein the first conductive smoothing layer has a surface roughness less than that of the capping layer;
a dielectric layer formed on the first conductive smoothing layer; and
a second electrode formed over the dielectric layer.

* * * * *